United States Patent
Lung (10) Patent No.: US 7,279,380 B2
(45) Date of Patent: Oct. 9, 2007

(54) METHOD OF FORMING A CHALCOGENIDE MEMORY CELL HAVING AN ULTRASMALL CROSS-SECTIONAL AREA AND A CHALCOGENIDE MEMORY CELL PRODUCED BY THE METHOD

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 240 days.

(21) Appl. No.: 10/985,481

(22) Filed: Nov. 10, 2004

(65) Prior Publication Data

US 2006/0099743 A1    May 11, 2006

(51) Int. Cl.
*H01L 21/8242* (2006.01)
*H01L 21/20* (2006.01)
*H01L 21/3205* (2006.01)

(52) U.S. Cl. .............. 438/244; 438/387; 438/302; 438/720; 257/E21.584; 257/E21.591; 257/E21.592

(58) Field of Classification Search ............. 438/95, 438/244, E21.584, E21.591, E21.592, 720; 257/E21.584, E21.591, E21.592
See application file for complete search history.

(56) References Cited

U.S. PATENT DOCUMENTS

| 6,031,287 | A  | 2/2000 | Harshfield       |
|-----------|----|--------|------------------|
| 6,111,264 | A  | 8/2000 | Wolstenholme et al. |
| 6,114,713 | A  | 9/2000 | Zahorik          |
| 6,189,582 | B1 | 2/2001 | Reinberg et al.  |
| 6,514,788 | B2 | 2/2003 | Quinn            |
| 6,597,009 | B2 | 7/2003 | Wicker           |

*Primary Examiner*—Michael Lebentritt
*Assistant Examiner*—Ron Pompey
(74) *Attorney, Agent, or Firm*—Stout, Uxa, Buyan & Mullins, LLP (57) ABSTRACT

A method of fabricating a chalcogenide memory cell is described. The cross-sectional area of a chalcogenide memory element within the cell is controlled by the thickness of a bottom electrode and the width of a word line. The method allows the formation of ultra small chalcogenide memory cells.

12 Claims, 9 Drawing Sheets

METHOD OF FORMING A CHALCOGENIDE MEMORY CELL HAVING AN ULTRASMALL CROSS-SECTIONAL AREA AND A CHALCOGENIDE MEMORY CELL PRODUCED BY THE METHOD

CROSS-REFERENCE TO RELATED APPLICATIONS

This application is related to U.S. application Ser. No. 11/009,365, filed Dec. 9, 2004 and entitled Self-Aligned Small Contact Phase-Change Memory Method And Device.

BACKGROUND OF THE INVENTION

1. Field of the Invention

The present invention relates generally to semiconductor fabrication methods and, more particularly, to fabrication of a chalcogenide memory cell.

2. Description of Related Art

Electrically writable and erasable phase change materials have traditionally been used for memory devices. Chalcogenide materials can be electrically switched between two structural states of generally crystalline and generally amorphous local order. The generally crystalline state is a phase in which the material's atoms and/or electrons form a repeatable lattice structure, whereas the atoms and/or electrons of the generally amorphous state are randomly distributed. The structural state can also be switched among a range of detectable structural states of local order between the extremes of completely crystalline and completely amorphous states.

Currently favored chalcogenide materials that are used for phase change memory applications typically contain mixtures of Te, Se, Ge, Sb, Bi, Pb, Sn, As, S, Si, P, and/or O. Because of the range of structural states, a given as-deposited stoichiometric chalcogenide material can have varied bulk conductivities. Generally speaking, the more crystalline local order the state has, the higher the conductivity of the material. Moreover, the conductivity of the material can be selectively and repeatably established via an electrical pulse of given voltage and duration, herein called a setting or resetting voltage. The conductivity remains stable until another setting or resetting voltage of comparable size is applied. Furthermore, the conductivity of the material appears to vary inversely with the setting or resetting voltage and does not depend upon the previous state of the material, i.e., the material lacks hysteresis.

The aforementioned materials can be used to store and retrieve information within a non-volatile, overwritable memory cell. When different setting or resetting voltages are employed to change the conductivity of the material, the corresponding conductivities can be distinguished by various means including, but not limited to, the application of a relatively smaller voltage across the material within the cell. If, for example, two distinct setting or resetting voltages are used, one memory cell is able to store and retrieve one bit of binary encoded data. If more than two distinct setting or resetting voltages are used, then one memory cell is able to store and retrieve an analog form that can represent multiple bits of binary encoded data. Since the chalcogenide materials are able to maintain their respective conductivities, the memory cells are non-volatile, in that no refreshes are necessary to keep the data stored. The memory cells can also be directly overwritten, meaning that no data erasures are necessary prior to storing new data within the cells.

It is known that chalcogenide phase change memory is not easy to incorporate into a CMOS circuit because the chalcogenide material requires a relatively high current density to change its state. Reducing the cross-sectional area of the chalcogenide part can reduce the current requirement in direct proportion. Structures which have been developed and which reduce this cross-sectional area involve fabricating ultra small contacts and depositing the chalcogenide into the contacts. One of the methods of fabricating ultra small contacts involves using a dielectric film, i.e., a spacer, to further reduce the photolithographic limit as referenced in U.S. Pat. No. 6,111,264. This technique can reduce the cross-sectional area, but the shrinking ratio is limited by the spacer thickness. For example, if the pore diameter is 1600 Å and the spacer thickness is 400 Å, the shrinkage area ratio is only about 4:1. The minimum pore diameter is determined by the photolithography and the spacer thickness. The shrinkage ratio can be limited. Thus, it can be difficult to scale down the chalcogenide parts in this fashion. If the chalcogenide parts cannot be scaled down, then relatively large current is required to cause a state change in the material. A requirement for larger current corresponds to a requirement for greater power to operate an array of such memory cells.

There can be additional problems once the pores are scaled down. For instance, the uniformity of the pore-to-pore diameters can be poor. Moreover, the small pores can place constraints on the chalcogenide deposition process since it will be more difficult to deposit materials into the tiny openings. For example, in the context of pores formed using the process of the preceding paragraph, overhang of the spacer may partially or fully occlude the pore, further compromising the reliability of the deposition procedure. Additionally, if the bottoms of the pores receive poor bottom coverage, the electrodes beneath them may not be able to predictably change the phases of the chalcogenide parts. If the phases are not repeatable when a given current is applied, the memory cell cannot reliably store data.

A need thus exists in the prior art for a chalcogenide memory cell capable of reliably storing data under the control of a relatively small current. A further need exists for a method of fabricating an electrode for making contact with chalcogenide material using a relatively small cross-sectional area.

SUMMARY OF THE INVENTION

The present invention addresses these needs by providing a method of forming a chalcogenide memory cell wherein contact with the chalcogenide memory cell is established with a very small cross-sectional area. The method controls the size of the cross-sectional area by controlling a thickness of a bottom electrode and a width of a word line. According to an embodiment of the method, a bottom electrode is formed over a substrate, and a chalcogenide memory element is disposed on the bottom electrode. The word line is formed on the chalcogenide memory element.

The invention herein disclosed further comprises a memory cell formed according to the method. An embodiment of the memory cell comprises a bit line disposed within a substrate and an isolation device that is formed above the bit line. A bottom electrode having a thickness is formed above the isolation device. This embodiment further comprises a chalcogenide memory element disposed on the bottom electrode and a word line having a width. The word line is disposed on the chalcogenide memory element, a cross-sectional area of the chalcogenide memory element being determined by the thickness of the bottom electrode and the width of the word line.

Another embodiment of the present invention comprises an array of memory cells including bit lines disposed in a reference direction and word lines having widths and being disposed in a direction other than the reference direction. Memory cells are located at intersections of bit lines and word lines. Each memory cell comprises a bottom electrode having a thickness and being disposed between one of the word lines and one of the bit lines at one of the intersections. A chalcogenide memory element is disposed between the bottom electrode and the word line of each memory cell, wherein a cross-sectional area of the chalcogenide memory element is defined by the thickness of the bottom electrode and the width of the word line.

The present invention further comprises a method of operating a chalcogenide memory cell comprising a method for resetting and setting the chalcogenide memory cell. The method of resetting the chalcogenide memory cell comprises applying an amorphizing current pulse to the chalcogenide memory cell such that a temperature of a chalcogenide memory element within the chalcogenide memory cell is raised above a first temperature. The amorphizing current pulse further causes the temperature of the chalcogenide memory element to remain above a second temperature less than the first temperature for a first time interval. The method of setting the chalcogenide memory cell comprises applying a crystallizing current pulse to the chalcogenide memory cell such that the temperature of the chalcogenide memory element is raised to a temperature above the second temperature and such that the temperature of the chalcogenide memory element is caused to remain above the second temperature for at least a second time interval. The duration of the second time interval is greater than the duration of the first time interval.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of chalcogenide memory structures. The present invention may be practiced in conjunction with various integrated circuit fabrication techniques that are conventionally used in the art, and only so much of the commonly practiced process steps are included herein as are necessary to provide an understanding of the present invention.

Figure 1:
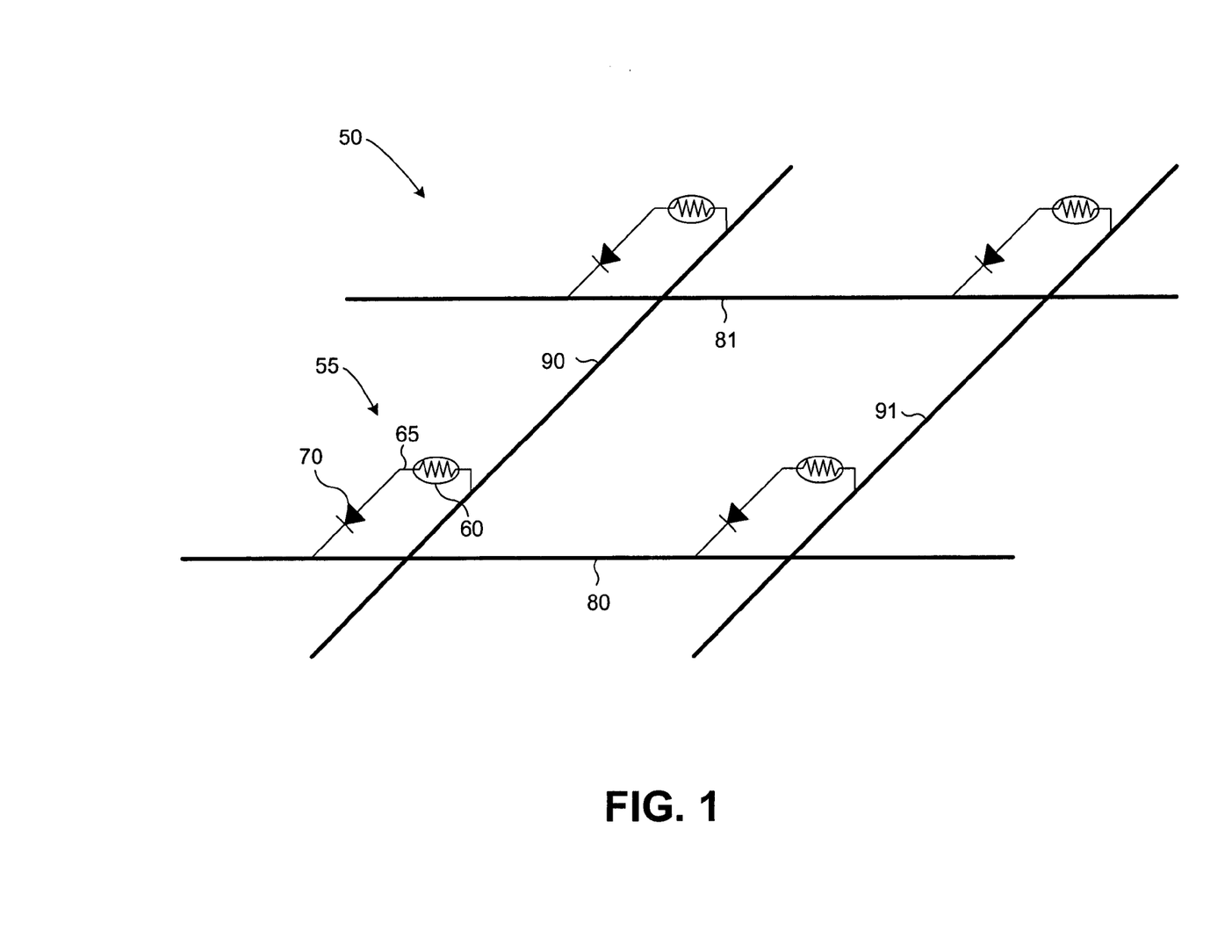
FIG. 1 is a schematic diagram of a portion of an embodiment of an array of chalcogenide memory cells.

Referring more particularly to the drawings, FIG. 1 is a schematic diagram of a portion of an embodiment of an array 50 of chalcogenide memory cells. An illustrated chalcogenide memory cell 55 comprises a chalcogenide memory element 60 electrically connected to a word line 90. An isolation device 70 in the illustrated embodiment connects the chalcogenide memory element 60 to a bit line 80 through a bottom electrode 65. Although FIG. 1 illustrates four chalcogenide memory cells for simplicity, a typical array may comprise thousands of such cells. Two bit lines 80 and 81 and two word lines 90 and 91 are shown in FIG. 1. Again, typical chalcogenide memory arrays may comprise large numbers of bit and word lines that connect to control circuitry capable of applying setting and resetting voltages to chalcogenide memory cells. For example, to operate chalcogenide memory cell 55, a setting or resetting potential may be applied between word line 90 and bit line 80, chalcogenide memory cell 55 being located at the intersection of word line 90 and bit line 80.

Figure 2:
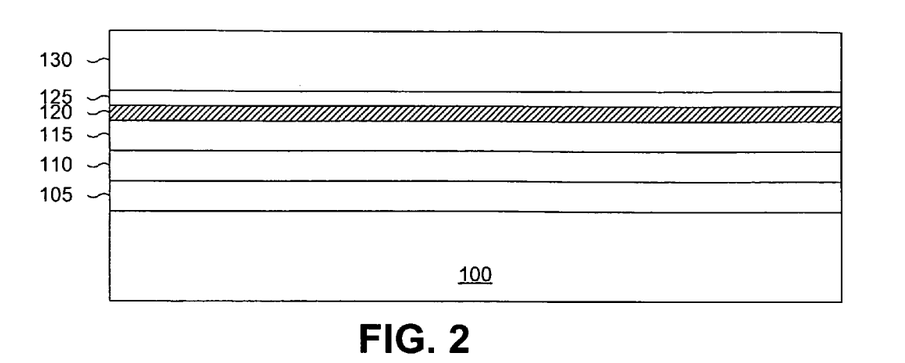
FIGS. 2-6 are cross-sectional diagrams showing results of early steps of a method of forming a chalcogenide memory cell in accordance with the present invention.

FIG. 2 is a cross-sectional diagram that illustrates processing layers associated with the fabrication of a chalcogenide memory cell. Although reference is made in the text to a single chalcogenide memory cell, the diagrams to follow illustrate a plurality of chalcogenide memory cells formed on a single substrate. The method herein disclosed may apply to the formation of a relatively large number of such chalcogenide memory cells. According to a typical embodiment, fabrication of a chalcogenide memory cell comprises forming several doped layers on a P-type substrate 100 using methods well known in the art. The P-type substrate 100 may be formed of silicon doped with, for example, about $10^{11}$-$10^{13}$ atoms of boron per cubic centimeter. An N+ layer 105 comprising silicon doped with, for example, about $10^{14}$-$10^{16}$ atoms of phosphorous or arsenic per cubic centimeter may be formed above the P-type substrate 100. In the illustrated embodiment, an N− layer 110 formed of silicon doped with, for example, about $10^{12}$-$10^{14}$ of dopant atoms per cubic centimeter overlies the N+ layer 105. A P+ layer 115, formed by doping intrinsic silicon to a concentration of about $10^{14}$-$10^{16}$ dopant atoms per cubic centimeter, overlies the N− layer 110. According to a representative embodiment of the chalcogenide memory cell, the N+ layer 105 is used to form a bit line, and the P+/N− layers 115/110 form a PN diode that functions as an isolation device 70 as introduced in FIG. 1. These details are more fully described in that which follows.

A silicide layer 120 formed, for example, of tungsten silicide, cobalt silicide, or titanium silicide, overlies the P+ layer 115, and a buffer layer 125 is formed over the silicide layer 120. The buffer layer 125 may comprise a layer of insulating material formed of, for example, silicon dioxide. A silicon nitride layer 130 overlies the buffer layer 125.

Figure 3:
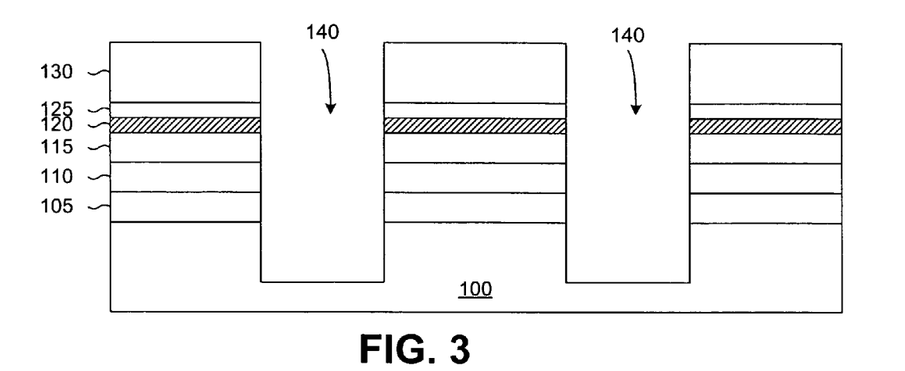

FIG. 3 is a cross-sectional view of a result of forming trenches 140 in the layered structure described in FIG. 2. The trenches 140 may be formed by coating an upper surface of the layered structure with a photoresist material and patterning the photoresist layer using a photolithographic process. The materials that form the layered structure may then be etched according to the photoresist pattern. The etch operation may include, for example, multiple etching processes performed in sequence. For example, a first etch process may be a selective etch process (e.g., a dry plasma etch process) in which the etchant has a higher selectivity for nitride than for oxide. The first etch process may remove material in the silicon nitride layer 130. A second etch process may be a selective etch process (e.g., a dry plasma etch process) in which the etchant has a higher selectivity for oxide than for silicide. The second etch process may remove material in the buffer layer 125. A third etch process, which may remove material in the silicide layer 120, may be a selective etch process in which the etchant has a higher selectivity for silicide than for silicon. A fourth etch process (e.g., a dry plasma etch process) may be used to etch silicon that forms the P+ layer 115, the N− layer 110, the N+ layer 105, and a portion of the P-type substrate 100.

Figure 4:
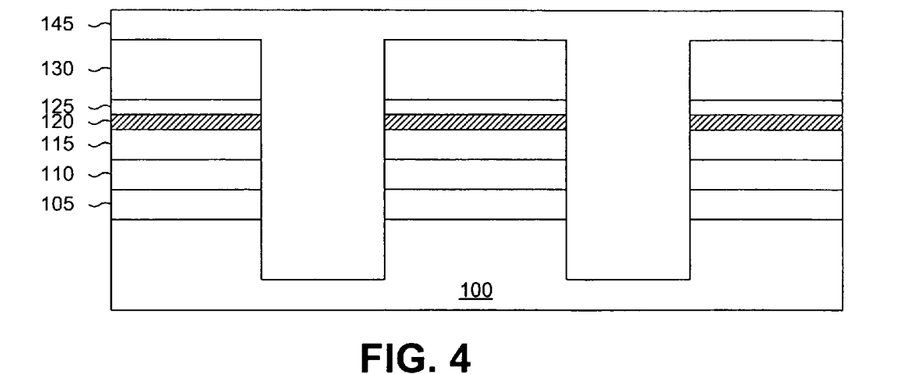
Figure 5:
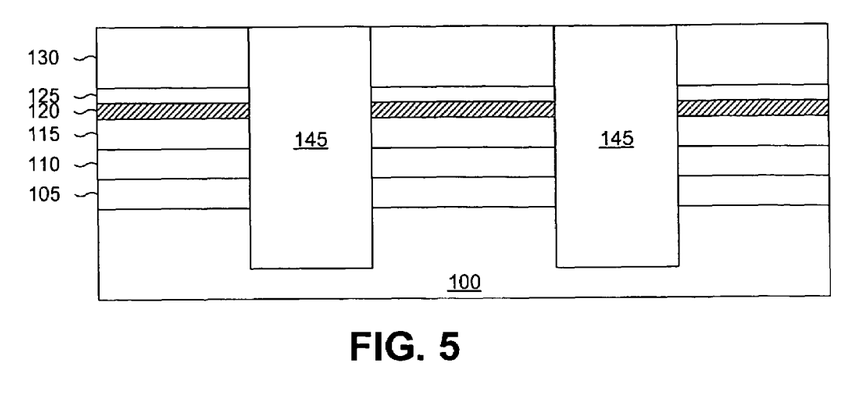

FIG. 4 is a cross-sectional diagram describing the result of depositing high-density plasma (HDP) oxide 145 on the structure illustrated in FIG. 3. The HDP oxide 145 fills the trenches 140 (FIG. 3) and overlies the silicon nitride layer 130. FIG. 5 is a cross-sectional diagram illustrating the result of performing chemical mechanical polishing (CMP) on the HDP oxide 145. The CMP operation nominally is terminated at an upper surface of the silicon nitride layer 130.

Figure 6:
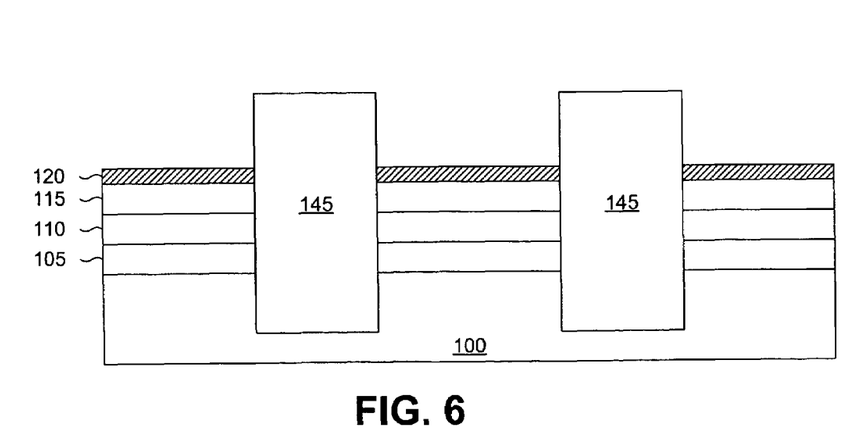

The cross-sectional diagram of FIG. 6 depicts the result of selectively removing the silicon nitride layer 130 and the buffer layer 125 from the structure illustrated in FIG. 5. The removing may include, for example, at least one or multiple etching processes performed in sequence. For example, a first etch process may be used to remove the silicon nitride layer 130 using an etchant having a higher selectivity for nitride than oxide, and a second etch process may be used to remove the buffer layer 125 in which the etchant has a higher selectivity for oxide than for silicide. Alternatively, the silicon nitride layer 130 may be removed by hot phosphoric acid. The effect of the removal is to form features of HDP oxide material 145 that extend above the silicide layer 120.

Figure 7:
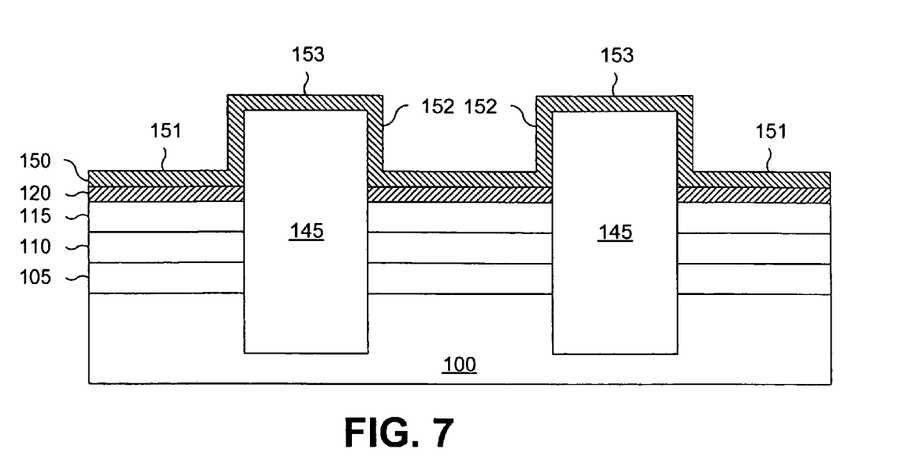
FIGS. 7-12 are cross-sectional diagrams illustrating formation of a bottom electrode according to the present invention.

FIG. 7 is a cross-sectional diagram illustrating the result of depositing a film of conducting material 150 on an exposed upper surface of the structure of FIG. 6. The conducting material 150 covers the silicide material 120, thereby forming a lower horizontal portion 151 of conducting material 150. The conducting material 150 also is deposited on side walls of the features formed by the HDP oxide material 145, thereby forming a vertical portion 152 of conducting material 150. An upper horizontal portion 153 of the conducting material 150 overlies the features formed by the HDP oxide material 145. The vertical portion 152 and the lower horizontal portion 151 of the conducting material 150 will be used in later steps of the method to form a bottom electrode 65 for the chalcogenide memory cell 55 as schematically illustrated in FIG. 1. According to a typical embodiment, the conducting material 150 may comprise polysilicon or a metal such as W, Ta, TiN, TiW, TaN, or TiAlN and may be deposited by a process such as chemical vapor deposition (CVD) or physical vapor deposition (PVD). The conducting material 150 can be deposited in typical embodiments to a thickness ranging from about 50 Å to about 500 Å, and in a preferred embodiment can be deposited to a thickness of about 100 Å.

Figure 8:
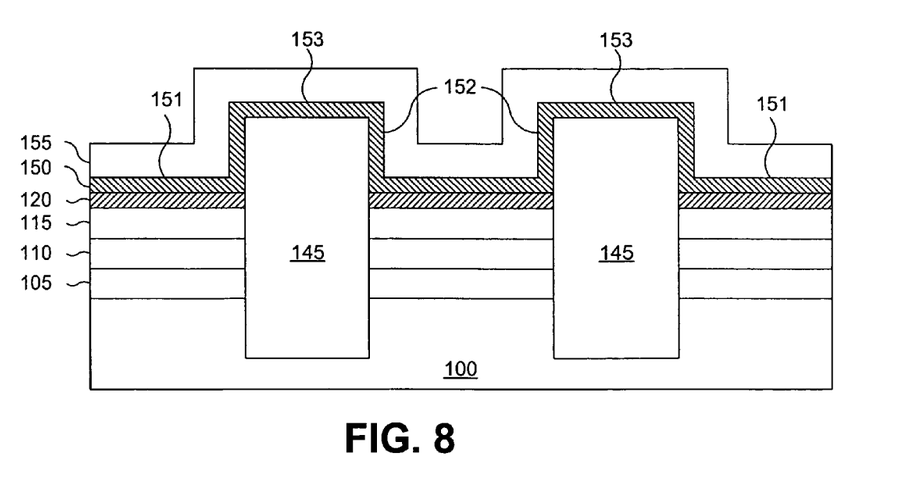
Figure 9:
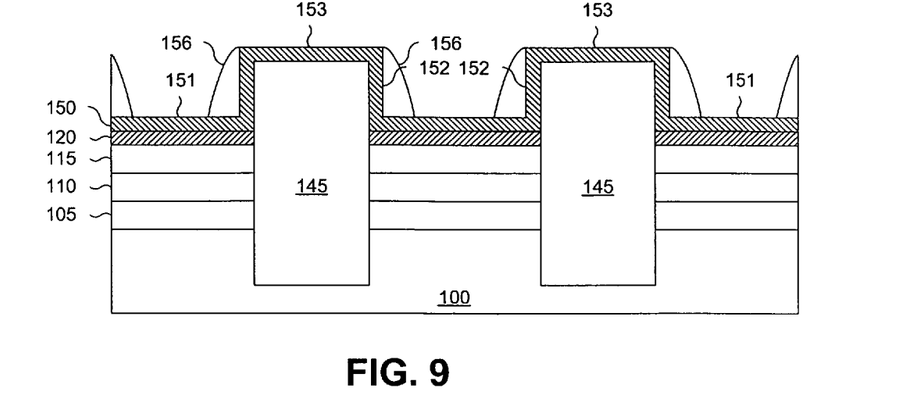

A cross-sectional diagram describing the result of disposing an oxide layer 155 on the conducting material 150 is shown in FIG. 8. The oxide layer 155 may comprise silicon dioxide according to an exemplary embodiment and typically is deposited using a CVD process. In accordance with an illustrated embodiment, the oxide layer 155 is applied uniformly over substantially all of the exposed surfaces of the structure. Oxide spacers 156 (FIG. 9) can be formed by performing an anisotropic etch on the structure depicted in FIG. 8. The anisotropic etch is directed in a nominally vertical direction in order to remove horizontal portions of the oxide layer 155 (FIG. 8) while leaving residual oxide spacers 156, as shown in FIG. 9, that cover the vertical portions 152 and part of the lower horizontal portions 151 of the conducting material 150. As presently embodied, all horizontally-disposed regions of the oxide layer 155 are etched by application of, for example, a reactive ion beam downwardly directed onto the substrate. The characteristics of pressure and power, for example, can be varied in the anisotropic etching process to accelerate ions vertically as opposed to at angles. The residual oxide spacers 156 of FIG. 9 have rounded or curved shapes in the illustrated embodiment and serve to narrow openings generally defined between features of HDP oxide material 145.

Figure 10:
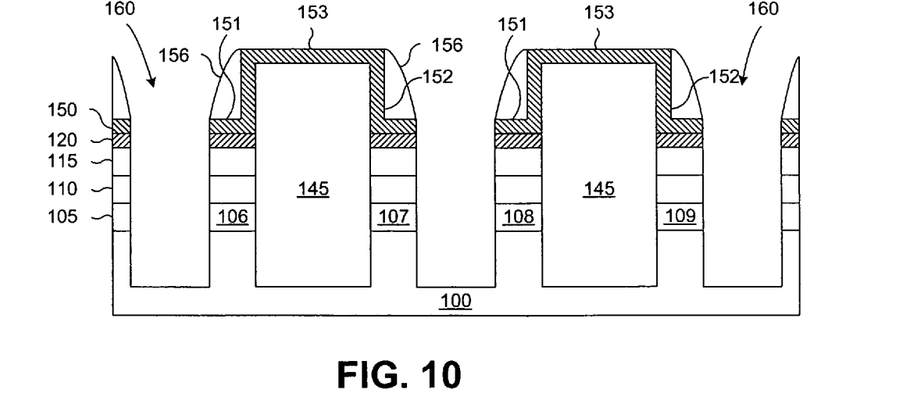

With reference to FIG. 10, trenches 160 are next formed in the structure of FIG. 9. The trenches 160 may be generated by using the oxide spacers 156 as hard masks and then etching according to the pattern of the oxide spacers 156. The etch operation may include, for example, multiple etching processes performed in sequence. For example, a first etch process may be a selective etch process in which the etchant has a higher selectivity for the conducting material 150 than for silicide and oxide, to thereby facilitate removal of exposed lower horizontal portions 151 of the conducting material 150. A second etch process, which may remove material in the silicide layer 120, may be a selective etch process in which the etchant has a higher selectivity for silicide than for silicon and oxide. A third etch process may be used to etch silicon that forms the P+ layer 115, the N− layer 110, the N+ layer 105, and a portion of the P-type substrate 100, while continuing to use the patterned photoresist and oxide spacers 156 as masks.

The formation of the trenches 160 has the effect of establishing self-aligned bit lines 106-109 formed of the N+ layer 105. According to an exemplary embodiment, the bit lines 106-109 extend in a direction nominally orthogonal to the plane of the diagram, i.e. into the plane of the diagram.

Figure 11:
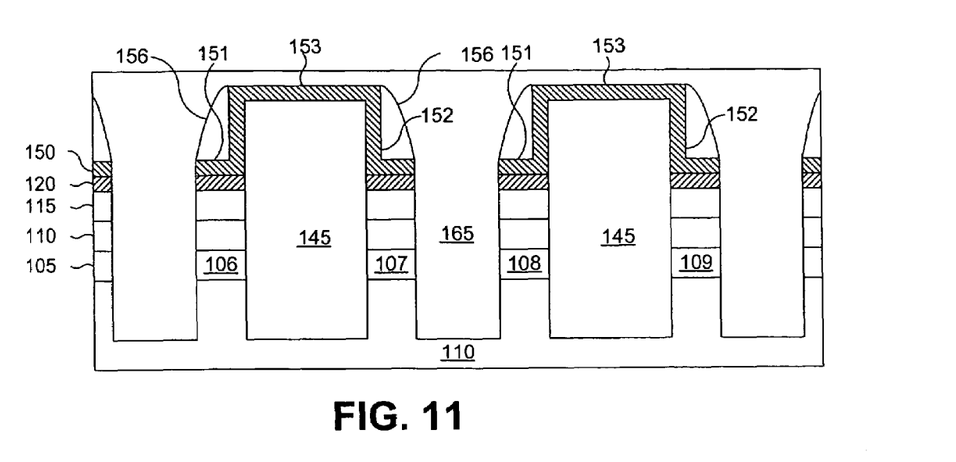
Figure 12:
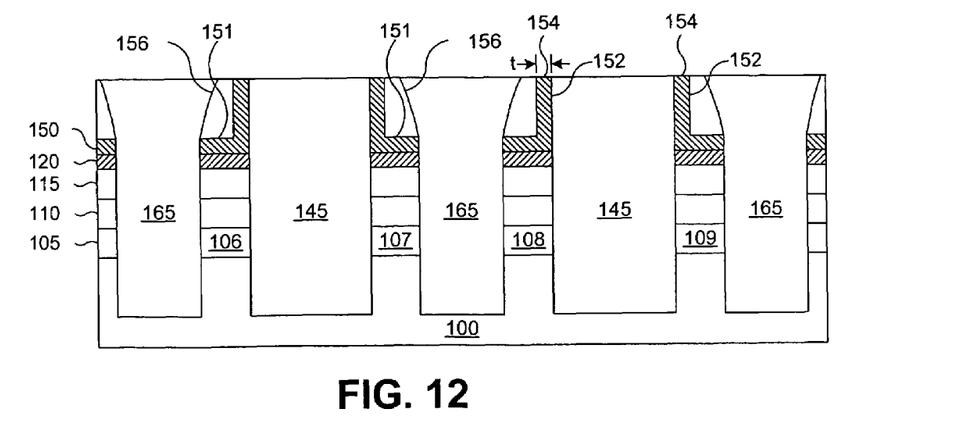

Turning to the cross-sectional diagram of FIG. 11, the structure of FIG. 10 is modified through formation of a HDP oxide 165 over the oxide spacers 156 and the upper horizontal portions 153 of the conducting material 150 and into the trenches 160 (FIG. 10). FIG. 12 is a cross-sectional diagram depicting the result of performing a CMP operation on the structure illustrated in FIG. 11. The CMP operation removes a portion of the HDP oxide 165, a portion of the oxide spacers 156, and the upper horizontal portion 153 (FIG. 11) of the conducting material 150. Removing the upper horizontal portion 153 of the conducting material 150 exposes a surface 154 of the vertical portion 152 of conducting material 150. The exposed surface 154 has a thickness t determined by the thickness of the layer of conducting material 150. It should be noted that the thickness t does not depend upon parameters of a photolithographic process. As noted above with reference to FIG. 7, the thickness t can range from about 50 Å to about 500 Å.

Figure 13:
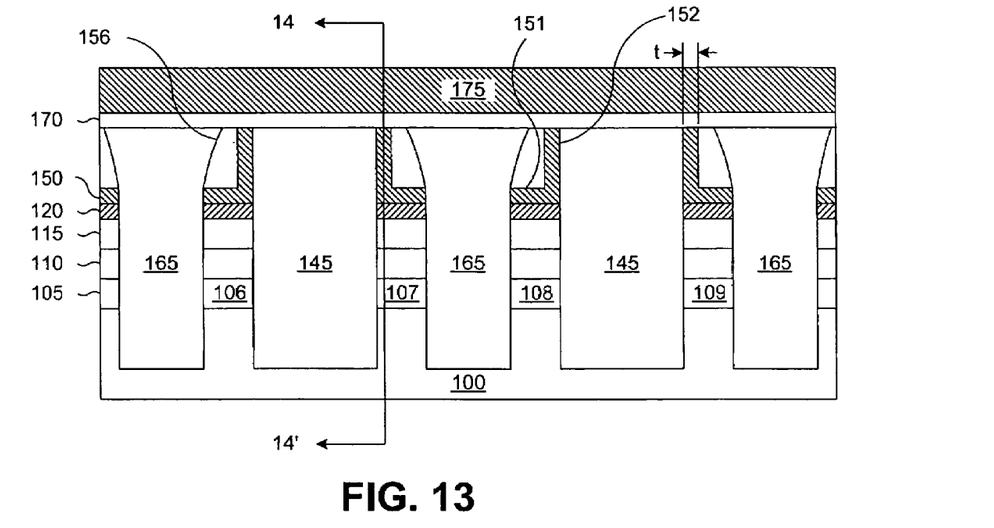
FIG. 13 is a cross-sectional diagram showing the result of depositing a layer of chalcogenide material and a layer of word line material on the device of FIG. 12.

FIG. 13 is a cross-sectional diagram showing the result of depositing a layer of chalcogenide material 170 and a layer of word line material 175 on the device of FIG. 12. According to exemplary embodiments, the chalcogenide material 170 may be formed, for example, of germanium, antimony, and tellurium (e.g. $Ge_2Sb_2Te_5$). The chalcogenide material 170 may be deposited using a PVD process to thicknesses ranging from about 100 Å to about 1000 Å and in an illustrated embodiment about 500 Å. The word line material 175 overlies the chalcogenide material 170 in the illustrated embodiment. The word line material 175, which may comprise tungsten, aluminum, copper, an aluminum copper alloy, or the like, may be deposited using a sputtering or chemical vapor deposition (CVD) process. The word line material 175 may be patterned to form a word line 176 (FIG. 14) that extends in a direction parallel to the plane of the diagram in FIG. 13.

Figure 14:
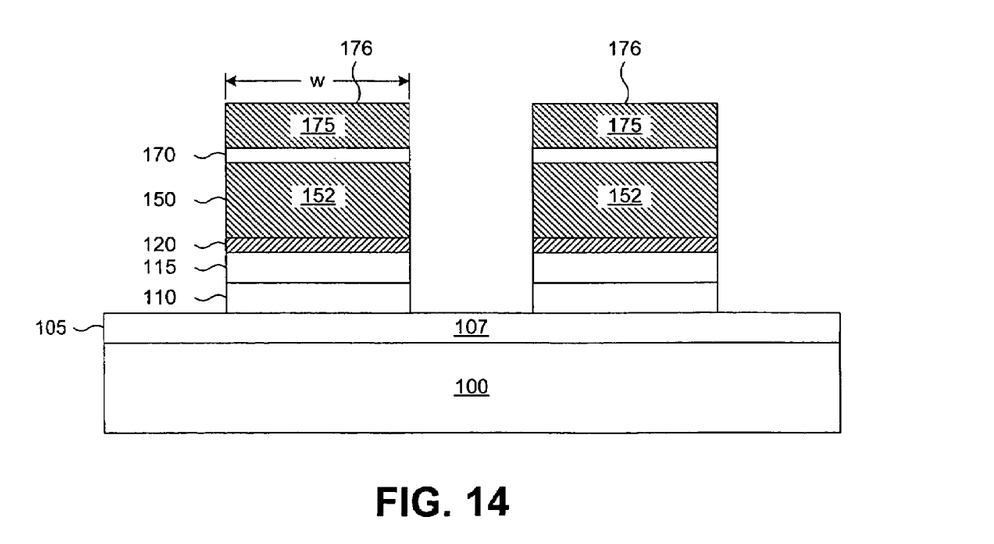
FIGS. 14-16 are cross-sectional diagrams illustrating the formation of word lines.

FIG. 14 is a cross-sectional diagram illustrating the result of patterning and etching the word line material 175 using known techniques to form word lines 176. The view depicted in FIG. 14 is taken along a line 14-14' of FIG. 13. The word lines 176 have a width w defined by a photolithographic process used to pattern the word line material 175. The patterning and etching procedure may comprise performing multiple etching processes in sequence similar to those described above. The etching procedure forms stacks of layers that correspond to elements of a chalcogenide memory cell 55 as introduced schematically in FIG. 1.

Figure 15:
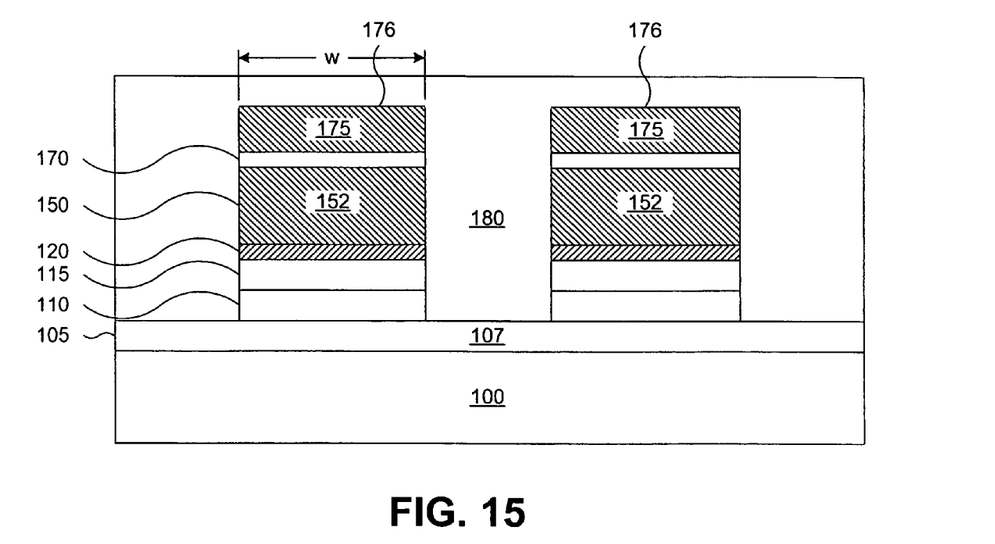
Figure 16:
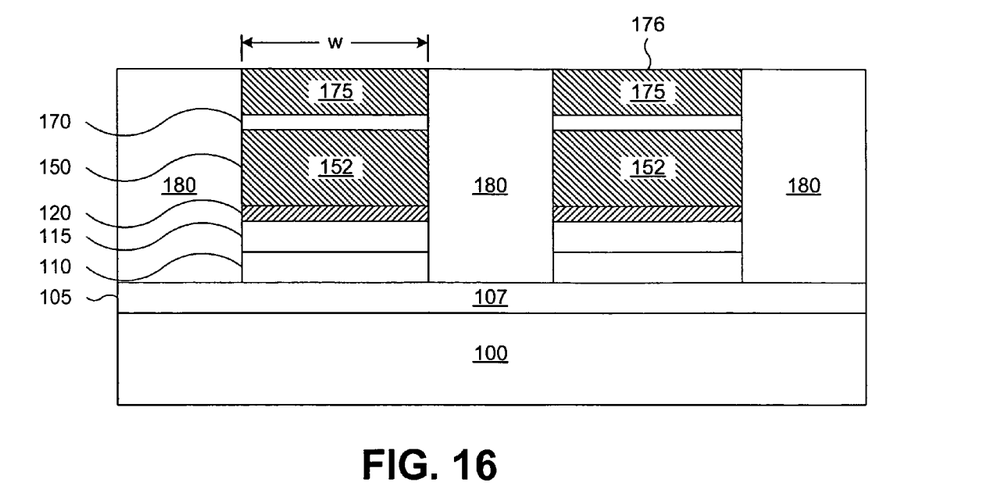

An HDP oxide 180 is then deposited over the structure illustrated in FIG. 14 to obtain the configuration shown in FIG. 15. The HDP oxide 180 provides isolation between the word lines 176. With reference to FIG. 16, a CMP step is then performed to remove excess HDP oxide 180 from an upper surface of the word lines 176.

Figure 17:
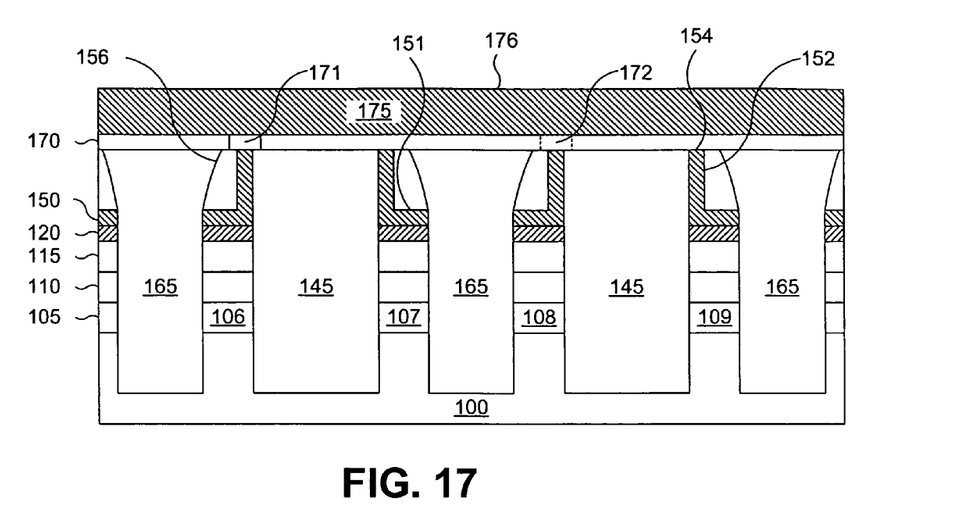
FIG. 17 is a cross-sectional diagram pointing out the effect of setting and resetting chalcogenide memory cells.

The cross-sectional diagram of FIG. 17, which corresponds to FIG. 13, illustrates how individual chalcogenide memory cells may be formed by the process just outlined. Table 1 summarizes correspondences between elements introduced in FIG. 1 and portions of the structure illustrated in FIG. 17.

TABLE 1

| FIG. 1 | FIG. 17 |
|---|---|
| Bit line 80 | Bit line 107 |
| Isolation device 70 | P+/N− layers 115/110 and silicide layer 120 |
| Bottom electrode 65 | Conducting material 150, lower horizontal portion 151, vertical portion 152, and surface 154 |
| Chalcogenide memory element 60 | Chalcogenide memory elements 171 and 172 |
| Word line 90 | Word line 176 |

Specifically, bit line 80 (FIG. 1) may correspond to bit line 107. Isolation device 70 (FIG. 1) is formed in the illustrated embodiment by N− layer 110 and P+ layer 115. Salicide layer 120 provides electrical contact between the P+ layer 115 of the isolation device 70 (FIG. 1) and bottom electrode 65 (FIG. 1). The bottom electrode 65 (FIG. 1) is formed of conducting material 150 having lower horizontal portion 151, vertical portion 152, and surface 154. The chalcogenide memory element 60 (FIG. 1) corresponds, for example, to regions 171 and 172 that exist between surface 154 of conducting material 150 and the word line 176. The word line 176 corresponds to word line 90 (FIG. 1). The sizes of the exemplary regions 171 and 172 that form chalcogenide memory elements have cross-sectional areas that are determined by the thickness t (see FIG. 13) of the vertical portion 152 of conducting material 150 that forms a bottom electrode and by the width w (see FIG. 16) of the word line 176. In typical embodiments, this cross-sectional area can be smaller than $4F^2$, where F is a minimum feature size that a technology can provide.

Chalcogenide memory elements corresponding, for example, to regions 171 and 172 may be operated by applying suitable voltages between word lines and bit lines. That is, the chalcogenide memory element that corresponds to region 171 may be operated by applying suitable voltages between bit line 106 the word line 176. Similarly, the chalcogenide memory element that corresponds to region 172 may be operated by applying suitable voltages between bit line 108 the word line 176.

Figure 18:
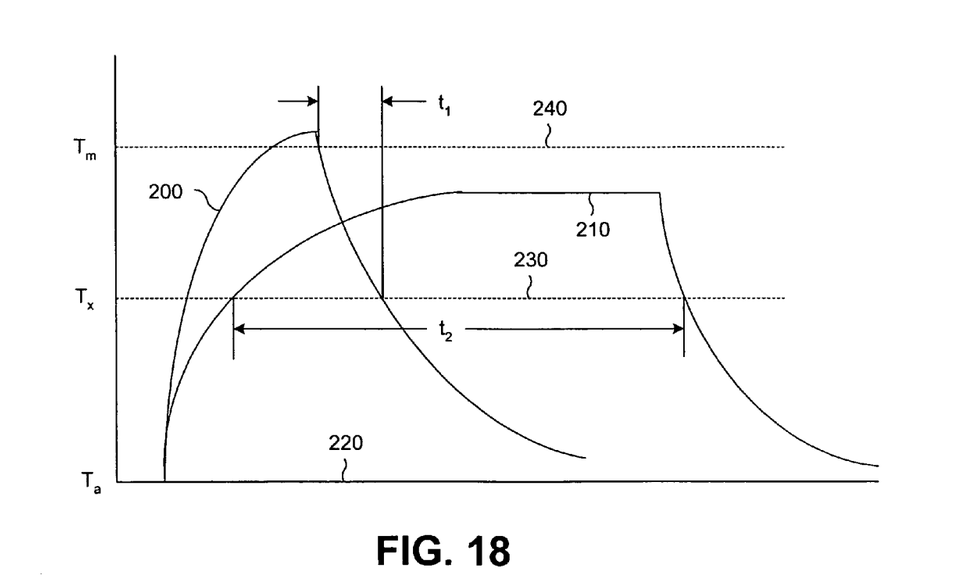
FIG. 18 is a graph of temperature waveforms associated with setting and resetting a chalcogenide memory cell.

FIG. 18 is a graph of temperature waveforms associated with setting and resetting a chalcogenide memory cell. The graph portrays temperature on a vertical axis with time on a horizontal axis. A chalcogenide memory cell may be reset, that is, the chalcogenide memory cell may be placed into an amorphous state, by applying a amorphizing pulse of current that changes the temperature of a chalcogenide memory element within the chalcogenide memory cell according to the amorphizing reset waveform 200. The amorphizing reset waveform 200 causes the temperature of the chalcogenide memory element to rise from an ambient temperature $T_a$ 220 above a maximum temperature $T_m$ 240 and then to remain above an intermediate temperature $T_x$ 230 for an amount of time $t_1$. With reference to FIG. 17, the chalcogenide memory element that corresponds to region 172 may be placed into an amorphous state by applying a reset pulse between bit line 108 and word line 176.

A chalcogenide memory cell may be set, that is the chalcogenide memory cell may be placed into a crystaline state by applying a crystalizing pulse of current that changes the temperature of the chalcogenide memory element according to the crystalizing waveform 210. The crystalizing set waveform 210 causes the temperature of the chalcogenide memory element to rise from the ambient temperature $T_a$ 220 above the intermediate temperature $T_x$ 230 but below the maximum temperature $T_m$ 240 for an amount of time $t_2$. With reference again to FIG. 17, the chalcogenide memory element that corresponds to region 171 may be placed into a crystalline state by applying a set pulse between bit line 106 and word line 176.

Typical values for $T_a$ 220, $T_x$ 230, and $Tm_m$ 240 are room temperature, 150° C., and 630° C., respectively. Time interval $t_l$ may range from about 0.1 ns to about 60 ns and $t_2$ may range from about 60 ns to about 100 μs.

In view of the foregoing, it will be understood by those skilled in the art that the methods of the present invention can facilitate formation of chalcogenide memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of forming a memory cell, comprising:
   forming a bottom electrode over a substrate;
   disposing a memory element on the bottom electrode; and
   forming a word line on the memory element to have a width of the bottom electrode, such that a cross-sectional area of the memory element is determined by a thickness of the bottom electrode and the width of the line.

2. The method as set forth in claim 1, wherein the disposing of a memory element comprises disposing a chalcogenide memory element.

3. The method as set forth in claim 2, further comprising:
   proving a self-aligned bit line in the substrate; and
   forming an isolation device on the line, the isolation device extending between the bit line and the bottom electrode.

4. The method as set forth in claim 3, wherein the forming of a bottom electrode comprises disposing a film of conducting material above the substrate.

5. The method as set forth in claim 4, wherein the disposing of a film of conducting material comprising:
   depositing a film of conducting material having a lower horizontal portion, a vertical portion, and an upper horizontal portion, each portion having a thickness; and
   removing the upper horizontal portion to create a contact, the width of which is the thickness of the vertical portion.

6. The method as set forth in claim 5, further comprising forming a silicide between the isolation device and the film of conducting material.

7. The method as set forth in claim 6, wherein the depositing of a film of conducting material comprising depositing polysilicon.

8. The method as set forth in claim 6, wherein the depositing of a film of conducting material comprises depositing a metillic compound selected from a group consisting of Tin, TiW, TaN and Tialn.

9. The method as set forth in claim 3, wherein the disposing of a memory element on the bottom electrode comprises disposing chalcogenide material on the bottom electrode.

10. The method as set forth in claim 9, wherein the forming of a word line comprises:
    depositing a layer of metal on the chalcogenide material; and
    patterning the layer of metal to from a line substantially orthogonal to the bit line.

11. The method as set forth in claim 2, further comprising:
    applying an amorphizing current pulse to the memory cell such that a temperature of the chalcogenide memory element is raised above a first temperature and such that the temperature of the chalcogenide memory element is caused to remain above a second temperature less than the first temperature for a first time interval; and
    setting the memory cell by applying a crystallizing current pulse to the chalcogenide memory element such that the temperature of the chalcogenide memory element is raised to a temperature above the second temperature and such that the temperature of the chalcogenide memory element is caused to remain above the second temperature for at least a second time interval, the duration of the second time interval being greater than the duration of the first time interval.

12. The method as set forth in claim 11, wherein:
    during the applying of an amorphizing current pulse to the memory cell the temperature of the chalcogenide memory element falls from the first temperature to the second temperature during a third time interval which is less than the second time interval; and
    during the setting of the memory cell the temperature of the chalcogenide memory element does not exceed the first temperature.

* * * * *